(12) United States Patent
Ruppu et al.

(10) Patent No.: US 7,648,736 B2
(45) Date of Patent: Jan. 19, 2010

(54) COATED CUTTING TOOL FOR TURNING OF STEEL

(75) Inventors: Sakari Ruppu, Fagersta (SE); Jenni Zackrisson, Fagersta (SE); Rolf Olofsson, Fagersta (SE)

(73) Assignee: Seco Tools AB, Fagersta (SE)

( * ) Notice: Subject to any disclaimer, the term of this patent is extended or adjusted under 35 U.S.C. 154(b) by 127 days.

(21) Appl. No.: 11/601,824

(22) Filed: Nov. 20, 2006

(65) Prior Publication Data

US 2007/0063387 A1 Mar. 22, 2007

Related U.S. Application Data

(62) Division of application No. 10/392,870, filed on Mar. 21, 2003, now Pat. No. 7,192,637.

(30) Foreign Application Priority Data

Mar. 22, 2002 (SE) .................................... 0200912

(51) Int. Cl.
*C23C 16/30* (2006.01)
*B32B 9/00* (2006.01)
(52) U.S. Cl. .................... 427/248.1; 428/216; 428/336; 428/472; 428/697; 428/698; 428/701; 428/702
(58) Field of Classification Search ....................... None
See application file for complete search history.

(56) References Cited

U.S. PATENT DOCUMENTS 4,277,283 A 7/1981 Tobioka et al.
(Continued)

FOREIGN PATENT DOCUMENTS

EP 0 600 115 6/1994
(Continued)

OTHER PUBLICATIONS

Frykholm, International J. of Refractory Metals & Hard Materials, V19, 2001, p. 527-538.*

(Continued)

*Primary Examiner*—Timothy H Meeks
*Assistant Examiner*—Joseph Miller, Jr.
(74) *Attorney, Agent, or Firm*—Drinker Biddle & Reath LLP

(57) ABSTRACT

A cutting tool insert includes a cemented carbide substrate and a coating. The cemented carbide substrate comprises WC, 4-7 wt % cobalt, 6-9 wt % cubic carbide forming metals from the groups IVB and VB, preferably titanium, tantalum and niobium, with a binder phase enriched surface zone with a thickness of >20 μm, preferably between 21 and 50 μm. The coating comprises a first layer adjacent the cemented carbide substrate of Ti(C,N) having a thickness of from about 3 to about 15 μm, an alumina layer adjacent said first layer having a thickness of from about 3 to about 15 μm, said alumina layer being composed of α-$Al_2O_3$, a further layer adjacent the alumina layer of a Ti(C,N) or Ti(C,O,N) having a thickness of from about 1 to 10 μm. The total thickness of the coating being less than 30 μm, preferably less than 20 μm. Inserts according to the invention exhibit favourable wear resistance and edge strength when turning steel.

20 Claims, 2 Drawing Sheets

U.S. PATENT DOCUMENTS

| | | |
|---|---|---|
| 4,548,786 A | 10/1985 | Yohe |
| 4,610,931 A * | 9/1986 | Nemeth et al. ............... 428/547 |
| 5,487,625 A | 1/1996 | Ljunberg et al. |
| 5,576,093 A * | 11/1996 | Yoshimura et al. .......... 428/216 |
| 5,652,045 A | 7/1997 | Nakamura et al. |
| 5,702,808 A | 12/1997 | Ljungberg et al. |
| 5,705,263 A | 1/1998 | Lenander et al. |
| 5,766,782 A | 6/1998 | Ljungberg et al. |
| 5,786,069 A | 7/1998 | Ljungberg et al. |
| 5,861,210 A | 1/1999 | Lenander et al. |
| 5,863,640 A | 1/1999 | Ljungberg et al. |
| 5,945,207 A | 8/1999 | Kutsher et al. |
| 6,221,469 B1 | 4/2001 | Ruppi |
| 6,221,479 B1 | 4/2001 | Waldenstrom et al. |
| 6,251,508 B1 | 6/2001 | Ruppi |
| 6,333,098 B1 | 12/2001 | Olsson et al. |
| 6,333,100 B1 | 12/2001 | Palmqvist et al. |
| 6,338,894 B1 | 1/2002 | Hirakawa et al. |
| 6,638,474 B2 | 10/2003 | Liu et al. |
| 6,720,095 B2 | 4/2004 | Ruppi et al. |
| 6,733,874 B2 | 5/2004 | Ueda et al. |
| 2001/0041107 A1 * | 11/2001 | Liu et al. .................... 407/119 |
| 2003/0211367 A1 | 11/2003 | Larsson et al. |
| 2003/0219633 A1 | 11/2003 | Sulin et al. |

FOREIGN PATENT DOCUMENTS

| | | |
|---|---|---|
| EP | 0 603 143 | 6/1994 |
| EP | 0 685 572 | 12/1995 |
| EP | 0 693 574 | 1/1996 |
| EP | 1 026 271 | 8/2000 |
| EP | 1 043 415 | 10/2000 |
| EP | 1 043 416 | 10/2000 |
| EP | 1 288 335 | 3/2003 |
| JP | 11-267904 | 10/1999 |
| JP | 11-269650 | 10/1999 |
| WO | WO 00/03048 A1 * | 1/2000 |

OTHER PUBLICATIONS

U.S. Appl. No. 10/389,737, filed Mar. 18, 2003, Sulin et al.
U.S. Appl. No. 10/389,738, filed Mar. 18, 2003, Larsson et al.
Swedish Patent Office Action dated Oct. 2, 2002.

* cited by examiner

COATED CUTTING TOOL FOR TURNING OF STEEL

CROSS-REFERENCE TO RELATED APPLICATIONS

This is a divisional application of copending application Ser. No. 10/392,870, filed on Mar. 21, 2003 now U.S. Pat. No. 7,192,637, which claims the benefit of priority under 35 U.S.C. § 119 to Swedish Application No. 0200912-4, filed in Sweden on Mar. 22, 2002, the entire contents of each of these prior applications is incorporated by reference herein.

FIELD OF THE INVENTION

The present invention relates to a coated cemented carbide materials such as a cutting tool insert particularly useful for turning of steels. More particularly, the present invention relates to coated inserts where the combination of a substrate with a very hard interior and a tough surface region, and a new coating design provides excellent wear resistance and edge strength, and thereby widely extends the application area.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Today, coated cemented carbide inserts with a binder phase-enriched surface zone are commonly used for machining of steel and stainless steel materials. The binder phase enriched surface zone widens the application area towards tougher cutting operations.

It has been known for some time how to produce binder phase enriched surface zones on cemented carbides containing WC, binder phase and cubic carbide phase, e.g.—see Tobioka (U.S. Pat. No. 4,277,283), Nemeth (U.S. Pat. No. 4,610,931) and Yohe (U.S. Pat. No. 4,548,786).

The patents by Tobioka, Nemeth and Yohe describe methods to accomplish binder phase enrichment in the surface region by dissolution of the cubic carbide phase close to the insert surfaces. Their methods require that the cubic carbide phase contains some nitrogen, since dissolution of cubic carbide phase at the sintering temperature requires a partial pressure of nitrogen, and nitrogen activity within the body being sintered exceeding the partial pressure of nitrogen within the sintering atmosphere. The nitrogen can be added through the furnace atmosphere during the sintering cycle and/or directly through the powder. The dissolution of cubic carbide phase, preferentially in the surface region, results in small volumes that will be filled with binder phase giving the desired binder phase enrichment. As a result, a surface zone consisting of essentially WC and binder phase is obtained. Although the cubic carbide phase is essentially a carbonitride phase, the material is herein referred to as a cemented carbide.

EP-A-1 026 271 relates to a coated cemented carbide insert with a highly alloyed Co binder phase. The insert has a binder phase-enriched surface zone of a thickness of <20 μm and along a line in the direction from the edge to the centre of the insert the binder phase content increases essentially continuously until it reaches the bulk composition. The use of a thin binder phase enriched surface zone is said to be favourable to avoid plastic deformation.

The new coating design for Ti(C,N)—Al$_2$O$_3$—Ti(C,N) coatings is disclosed in U.S. Pat. No. 6,221,469 and has been found to perform well and outperform competing products based on the layer design where Al$_2$O$_3$ is the outermost layer, covered only with a thin layer of TiN. This kind of new layer design can be applied on conventional or surface-modified cemented carbides according to U.S. Pat. No. 6,221,469. We have also shown that toughness of this coating can further be increased if the Al$_2$O$_3$ layer consists of α-Al$_2$O$_3$ (U.S. patent application Ser. No. 10/323,905). The α-Al$_2$O$_3$ intermediate layer is especially important when the tool is used in interrupted cutting or when cooling is applied, i.e.—in applications where the heat flow into the substrate is lower.

The thick Ti(C,N) coating is important because in many common steels both α-Al$_2$O$_3$ and κ-Al$_2$O$_3$ are clearly outperformed by MTCVD Ti(C,N) as far as flank wear is concerned. Consequently, in order to reduce flank wear it is important to protect the Al$_2$O$_3$ layer by a layer of Ti(C,N), for instance, according to U.S. Pat. No. 6,221,469. The Ti(C,N) layer is preferably deposited by MTCVD on α-Al$_2$O$_3$.

SUMMARY OF THE INVENTION

Surprisingly, it has now been found that this coating design performs extremely well when deposited on a substrate with a very hard interior and a tough surface zone. A cutting tool insert according to this invention exhibits a unique combination of wear resistance and toughness.

According to a first aspect, the present invention provides A coated cutting tool insert comprising a cemented carbide substrate and a coating:

the cemented carbide substrate comprises WC, 4-7 wt % cobalt, 6-9 wt % cubic carbide forming metals from the groups IVB and VB, the cemented carbide substrate has a binder phase enriched surface zone with a thickness of >20 μm; and the coating comprises a first layer adjacent the cemented carbide substrate of Ti(C,N) having a thickness of from about 3 to 15 μm, an alumina layer adjacent said first layer having a thickness of from about 3 to 15 μm, said alumina layer being composed of α-Al$_2$O$_3$, a further layer adjacent the alumina layer of Ti(C,N) or Ti(C,O,N) having a thickness of from about 1 to 10 μm, the total thickness of the coating is less than 30 μm, the thickness of the first Ti(C,N) layer is 1-3 times the thickness of the alumina layer, and the thickness of the outer Ti(C,N) layer is 0.1-1.2 times the thickness of the first Ti(C,N) layer and the alumina layer.

According to a further aspect, the present invention provides A method of making a cutting tool insert comprising a cemented carbide substrate with a binder phase enriched surface zone and a coating, the method comprising forming a powder mixture containing WC, 4-7 wt % Co, and 6-9 wt % cubic carbide forming metals from groups IVB or VB of the periodic table, whereby nitrogen is added in an amount >1.7% by weight, per each wt % of the elements from groups IVB and VB through the powder or through the sintering process or a combination thereof; mixing said powders with pressing agent and tungsten metal or carbon black to obtain a desired S-value;

milling and spray drying the mixture to a powder material with the desired properties;

compacting and sintering the powder material at a temperature of 1350-1500° C. in a controlled atmosphere followed by cooling;

applying one or more post sintering treatments including edge rounding; and applying a hard, wear resistant coating by CVD- and or MTCVD-technique.

DETAILED DESCRIPTION OF THE INVENTION

Figure 1:
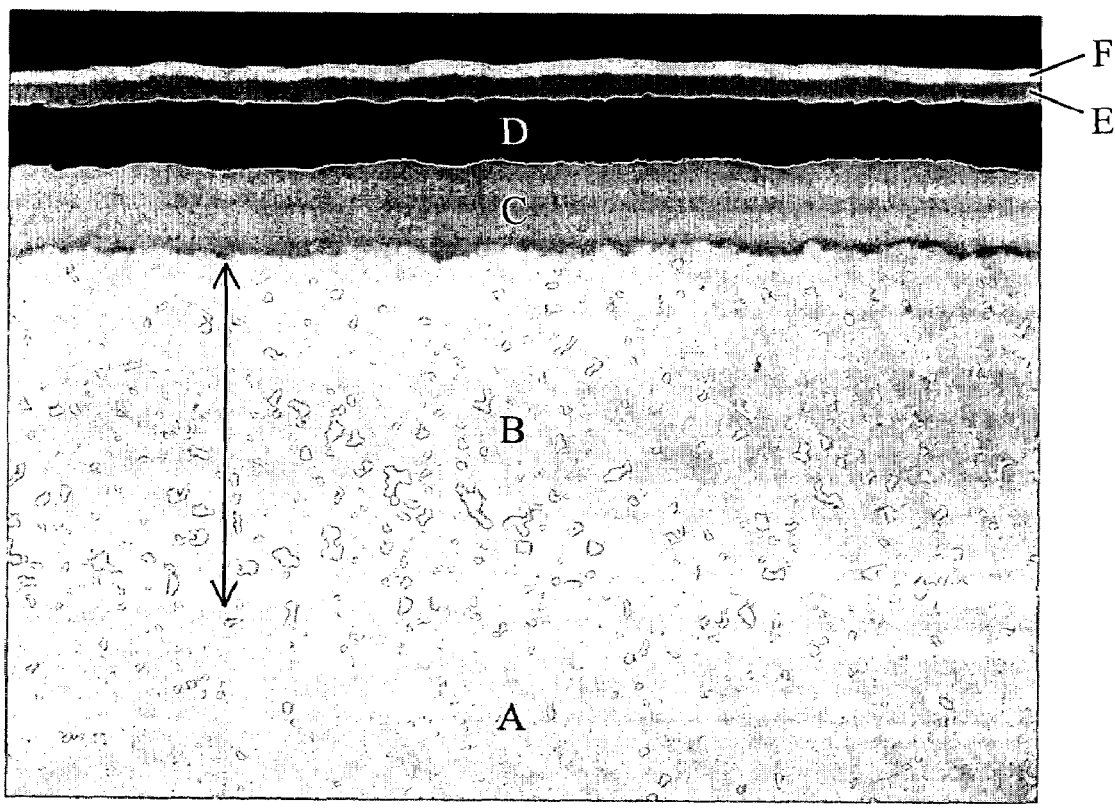
FIG. 1 shows in 1000× the structure of a cutting tool insert according to the invention.
Figure 2:
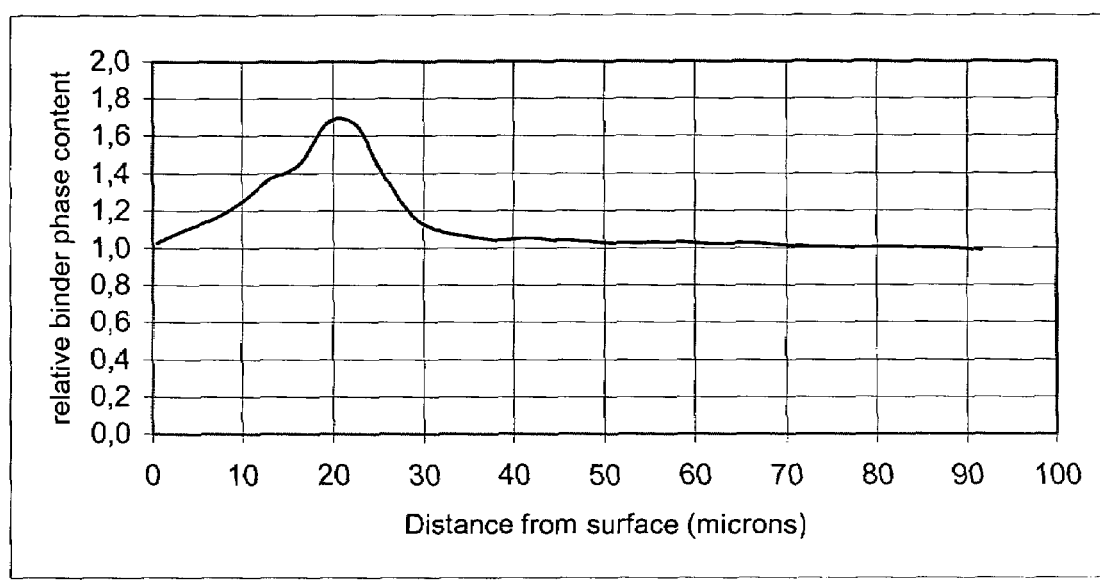
FIG. 2 shows the distribution of binder phase in the surface region as a function of the distance from the insert surface according to the invention.

According to the present invention a cemented carbide with a >20 μm, preferably 21-50 μm, thick binder phase enriched surface zone (B) is now provided. This zone is nearly free of cubic carbide phase. The maximum binder phase content of the binder phase enriched surface zone is 1.2-3 times greater (by volume) than the bulk binder phase content.

The cutting tool insert of the present invention consists of a cemented carbide substrate (A) and a coating, where the substrate comprises WC, binder phase and cubic carbide phase with a binder phase enriched surface zone (B) nearly free of cubic carbide phase. The cubic carbide phase comprises elements from the groups IVB, VB and VIB.

The present invention applies to cemented carbides with varying amounts of binder phase and cubic carbide phase. The binder phase preferably contains cobalt and dissolved carbide forming elements such as tungsten, titanium, tantalum and niobium. However, there is no reason to believe that an addition of nickel or iron should influence the result appreciably. Small additions of metals that can form intermetallic phases with the binder phase or any other form of dispersions are also believed not to affect the result appreciably.

The amount of the binder phase forming elements can vary between 4 and 7% by weight, preferably between 4.5 and 6% by weight.

The content of tungsten in the binder phase may be expressed as the S-value=$\sigma/16.1$, where $\sigma$ is the measured magnetic moment of the binder phase in $\mu Tm^3 kg^{-1}$. The S-value depends on the tungsten content of the binder phase and increases with a decreasing tungsten content. Thus, for pure cobalt, or a binder that is saturated with carbon, S=1 and for a binder phase with a tungsten content corresponding to the borderline to η-phase formation, S=0.78.

It has now been found according to the present invention that improved cutting performance is achieved if the cemented carbide body has an S-value within the range 0.80-0.94, preferably 0.84-0.89.

Furthermore the mean intercept length of the tungsten carbide phase measured on a ground and polished representative cross section is in the range 0.5-0.9 μm. The mean intercept length of the cubic carbide phase is essentially the same as for tungsten carbide. The intercept length is measured by means of image analysis on micrographs with a magnification of 10000× and calculated as the average mean value of approximately 1000 intercept lengths.

In a first preferred embodiment the amount of cubic carbide corresponds to 6-9% by weight of the cubic carbide forming elements titanium, tantalum and niobium, preferably 6.0-8.5% by weight. Titanium, tantalum and/or niobium may also be replaced by other carbides of elements from groups IVB, VB and VIB of the periodic table. The ratio of the contents by weight of tantalum to niobium is 1-2.5, preferably 1.5-1.9. The ratio of titanium to niobium is within 0.5-1.5 by weight, preferably 0.8-1.2 by weight.

The amount of nitrogen, added either through the powder or through the sintering process or a combination thereof, determine the rate of dissolution of the cubic carbide phase during sintering. The optimum amount of nitrogen depends on the amount and type of cubic carbide phase. According to the present invention the optimum amount of nitrogen to be added is >1.7% by weight, preferably 1.8-5.5% by weight, per every one % by weight of titanium, tantalum and niobium. Some of this nitrogen is lost during sintering.

Production of cemented carbides according to the invention is done in either of two ways or a combination thereof: (i) by sintering a presintered or compacted body containing a nitride or a carbonitride in an inert atmosphere or in vacuum as disclosed in U.S. Pat. No. 4,610,931, or (ii) by nitriding the compacted body as disclosed in U.S. Pat. No. 4,548,786 followed by sintering in an inert atmosphere or in vacuum.

The detailed structure of the coating of the present invention is shown in FIG. 1. The coating comprises several layers that are described below.

The first layer (C) is a Ti(C,N) layer composed of CVD Ti(C,N) or MTCVD Ti(C,N) or combinations thereof. A thin layer(s) of TiN (thickness<0.5 μm) may be applied in the coating, if necessary, several times to obtain grain refinement. The thickness of the first Ti(C,N) layer is 1 to 20 μm, preferably 3-15 μm. As a bonding layer deposited directly on the cemented carbide substrate a layer of TiN can be applied (thickness 0.5-2.0 μm).

Between the said first layer of Ti(C,N) and the following alumina layer (D) there is a bonding layer of Ti(C,O,N), which is necessary for good adhesion and control of the α phase. The alumina layer (D) comprises fine-grained α-phase and has a layer thickness of 1-20 μm, preferably 3-15 μm.

Adjacent the alumina layer (C) there is a layer of Ti(C,N), (Ti,Zr)(C,N), or Ti(C,O,N) (E), preferably deposited using MTCVD. The thickness of this layer is 1-15 μm, preferably 1-10 μm.

Finally, an optional layer of TiN (F) can be deposited atop of the described coating, the thickness being less than 3 μm, preferably 0.5-2 μm.

The total thickness of the coating should be less than 40 μm, preferably less than 30 μm, and most preferably less than 25 μm. The individual layers should have thickness according to the following criteria: the thickness of the first Ti(C,N) layer is 1-3 times the thickness of the alumina layer, and the thickness of the outer Ti(C,N) layer is 0.1-1.2 times the thickness of the first Ti(C,N) layer and the alumina layer.

EXAMPLE 1

Grade I

Cemented carbide substrates were produced by milling of a powder mixture of (Ti,W)C, Ti(C,N), (Ta,Nb)C, WC and Co with a composition of 2 wt % Ti, 3.4 wt % Ta, 2 wt % Nb, 5.3 wt % Co, 6.13 wt % C, balance W, pressing and sintering. The inserts were sintered in $H_2$ up to 400° C. for dewaxing and further in vacuum to 1260° C. From 1260° C. to 1350° C. the inserts were nitrided in an atmosphere of $N_2$ and after that in a protective atmosphere of Ar for 1 h at 1460° C.

The surface zone of the inserts consisted of a 30 μm thick binder phase enriched part nearly free of cubic carbide phase. The maximum Co content in this part was about 12 wt %. The S-value of the inserts was 0.87 and the mean intercept length of the tungsten carbide phase 0.7 μm. The inserts were coated using CVD- and MTCVD-techniques with a coating of 1 μm TiN, 8 μm MTCVD Ti(C,N), 6 μm α-$Al_2O_3$, 3 μm Ti(C,N) and 0.5 μm TiN.

EXAMPLE 2

Grade II

Example 1 was repeated but with nitrogen added directly to the powder in an amount of 0.25 wt % and with a sintering atmosphere free of $N_2$. The surface zone of the inserts consisted of a 17 µm thick binder phase enriched part nearly free of cubic carbide phase. The maximum Co content in this part was about 12 wt %. The S-value of the inserts was 0.87 and the mean intercept length of the tungsten carbide phase 0.7 µm. The inserts were coated according to Example 1.

EXAMPLE 3

Grade III

Example 1 was repeated concerning the cemented carbide substrate. The inserts were coated using CVD- and MTCVD-techniques with a coating of 1 µm TiN, 11 µm MTCVD Ti(C,N), 6µ α-$Al_2O_3$ and 0.5 µm TiN.

EXAMPLE 4

Grade IV—Comparative Example

Cemented carbide substrates were produced by milling of a powder mixture of (Ti,W)C, (Ta,Nb)C, WC and Co with a composition of 2 wt % Ti, 3.4 wt % Ta, 2 wt % Nb, 5.9 wt % Co, 6.30 wt % C, balance W, pressing and sintering. The inserts were sintered in $H_2$ up to 400° C. for dewaxing and further in vacuum to 1400° C. From 1400° C. to the sintering temperature 1490° C. there is a protective atmosphere of 50 mbar Ar. The holding time at the sintering temperature is 30 minutes.

These inserts have no binder phase enriched surface zone. The S-value of the inserts was 0.85 and the mean intercept length of the tungsten carbide phase 0.7 µm. The inserts were coated using CVD- and MTCVD-techniques with a coating of 6 µm Ti(C,N), 8 µm α-$Al_2O_3$ and 3 µm multilayered TiC/TN.

EXAMPLE 5

Grade V—Comparative Example

A cemented carbide insert in the P10-P15 application area from another producer was selected for comparison in a turning test.

EXAMPLE 6

Grade I, grade II and grade IV were tested with respect to toughness in longitudinal turning with interrupted cuts.
Work piece: Cylindrical slotted bar
Material: SS1672
Insert type: CNMG120408-M3
Cutting speed: 140 m/min
Feed: 0.1, 0.125, 0.16, 0.20, 0.25, 0.315, 0.4, 0.5, 0.63, 0.8 mm/rev gradually increased after 10 mm length of cut
Depth of cut: 2.5 mm
Remarks: dry turning
Tool life criteria: Gradually increased feed until edge breakage. 10 edges of each variant were tested.

| Results: | Mean feed at breakage (mm) |
|---|---|
| Grade I | 0.27 (invention) |
| Grade II | 0.22 (invention) |
| Grade IV | 0.15 (prior art) |

The test results show that grade I according to the invention exhibited better toughness behaviour than grade II and grade IV (prior art) due to the thick binder phase enriched surface zone.

EXAMPLE 7

Grade I, grade III, grade IV, grade V were tested with respect to flank wear in face turning of ball bearing material
Work piece: Cylindrical tubes (Ball bearings)
Material: SS2258
Insert type: WNMG080416
Cutting speed: 500 m/min
Feed: 0.5 mm/rev
Depth of cut: 1.0 mm
Remarks: Dry turning
Tool life criterion: Flank wear>0.3 mm, three edges of each variant were tested.

| Results: | Tool life (min) |
|---|---|
| Grade I | 17 (invention) |
| Grade III | 10.5 (invention) |
| Grade IV | 11 (prior art) |
| Grade V | 13 (prior art) |

The test results show that the cemented carbide tool according to the invention exhibit longer tool life than grade III, grade IV and grade V. The wear resistance of grade I illustrates the positive effect of the coating design of the invention compared with grades with coating design where $Al_2O_3$ is the layer directly beneath the TiN top layer.

EXAMPLE 8

This turning test will illustrate the benefit with Ti(C,N) as the top coating. Grade I and grade III were tested with respect to flank wear.
Work piece: Gear wheel
Material: 16MnCr5, forged
Insert type: WNMG060412-M3
Cutting speed: 400 m/min
Feed: 0.3 mm/rev
Depth of cut: 1 mm
Remarks: Wet turning
Tool life criterion: Flank wear after 250 parts, total time in cut was 26.5 minutes. Three cutting edges of each grade were tested.

| Results: | Flank wear (mm) |
|---|---|
| Grade I | 0.21 (invention) |
| Grade III | 0.35 (invention) |

The test results show that the cemented carbide tool according to the invention exhibited longer tool life than grade III.

EXAMPLE 9

In a test performed at an end-user in machining, flank wear due to plastic deformation and chipping of cutting edge were the dominating wear mechanisms.
Work piece: Shaft
Material: Tough hardened steel
Insert type: CNMG120808
Cutting speed: 280 m/min
Feed: 0.35-0.5 mm/rev
Depth of cut: 2 mm
Remarks: Wet turning
Tool life criterion: Flank wear.

| Results: | Flank wear (mm) | No. of parts |
|---|---|---|
| Grade I | 0.20 | 150 (invention) |
| Grade IV | 0.40 (chipping) | 90 (prior art) |
| Grade V | 0.28 | 100 (prior art) |

The test results show that the cemented carbide tool according to the invention exhibit longer tool life than grade IV (prior art) and grade V (prior art). Grade IV shows chipping of the cutting edge and grade V exhibits flank wear in combination with plastic deformation. Grade I according to the invention shows both better plastic deformation resistance and toughness performance against microchipping along the cutting edge than prior art grades. The invention shows advantages combining a substrate with a hard interior and a tough surface zone and a wear resistant coating.

The described embodiments of the present invention are intended to be illustrative rather than restrictive, and are not intended to represent every possible embodiment of the present invention. Various modifications can be made to the disclosed embodiments without departing from the spirit or scope of the invention as set forth in the following claims, both literally and in equivalents recognized in law.

We claim:

1. A method of making a cutting tool insert comprising a cemented carbide substrate with a binder phase enriched surface zone and a coating, the method comprising
    forming a powder mixture containing WC, 4-7 wt % Co, and 6-9 wt % cubic carbide forming metals from groups IVB or VB of the periodic table, wherein nitrogen is added in an amount >1.7% by weight per each wt % of the cubic carbide forming metals;
    mixing said powders with (a) pressing agent and (b) tungsten metal or carbon black to obtain a desired S-value;
    milling and spray drying the mixture to a powder material with the desired properties;
    compacting and sintering the powder material at a temperature of 1350-1500° C. in a controlled atmosphere followed by cooling;
    applying one or more post sintering treatments including edge rounding; and
    applying a hard, wear resistant coating by CVD- and or MTCVD-technique,
    wherein the cubic carbide forming metals include one or more of titanium, tantalum, niobium, vanadium, tungsten and molybdenum,
    wherein a ratio, by weight percent, of tantalum to niobium is 1-2.5 and a ratio, by weight percent, of titanium to niobium is 0.5-1.5, and
    wherein the coating comprises a first bonding layer of TiN adjacent the cemented carbide substrate, a first layer of Ti(C,N) having a thickness of from about 3 to 15 µm adjacent the first bonding layer, a second bonding layer of Ti(C,O,N) adjacent the first layer, followed by an alumina layer having a thickness of from about 3 to 15 µm, said alumina layer being composed of $\alpha$-$Al_2O_3$, a further layer adjacent the alumina layer of Ti(C,N) or Ti(C,O,N) having a thickness of from about 1 to 10 µm, and a layer of TiN deposited on top of the further layer of Ti(C,N) or Ti(C,O,N), wherein a total thickness of the coating is less than 40 µm, the thickness of the first Ti(C,N) layer is 1-2 times the thickness of the alumina layer, and the thickness of the further Ti(C,N) or Ti(C,O,N) layer is 0.1-1.2 times the thickness of the first Ti(C,N) layer and 0.1-1.2 times the thickness of the alumina layer.

2. The method according to claim 1, wherein the powder mixture is formed with 4.5-6 wt % Co and 6.5-8.5 wt % cubic carbide forming metals, and nitrogen is added in an amount of 1.8-5.5% by weight per each wt % of the cubic carbide forming metals.

3. The method according to claim 1, wherein nitrogen is added through the powder or through the sintering process or a combination thereof.

4. The method according to claim 1, wherein the cubic carbide forming transition metals are selected from the group consisting of titanium, tantalum, niobium and wherein nitrogen is added in an amount of 1.8-5.5% by weight per each wt % of the cubic carbide forming transition metals.

5. The method according to claim 1, wherein the ratio of tantalum to niobium is 1.5-1.9, and the ratio of titanium to niobium is 0.8-1.25.

6. The method according to claim 1, wherein the binder phase enriched surface zone has a binder phase maximum of 1.2-3 times a nominal binder phase content of the cemented carbide substrate.

7. The method according to claim 1, wherein the substrate has an S-value of 0.80-0.94.

8. The method according to claim 7, wherein the S-value is 0.84-0.89.

9. The method according to claim 1, wherein the cemented carbide substrate has a mean intercept length of the WC phase of 0.5 to 0.9 µm.

10. A method of making a cutting tool insert comprising a cemented carbide substrate with a binder phase enriched surface zone and a coating, the method comprising
    forming a powder mixture containing WC, 4-7 wt % Co, and 6-9 wt % cubic carbide forming metals from groups IVB or VB of the periodic table, wherein nitrogen is added in an amount >1.7% by weight per each wt % of the cubic carbide forming metals;
    mixing said powders with (a) pressing agent and (b) tungsten metal or carbon black to obtain a desired S-value;
    milling and spray drying the mixture to a powder material with the desired properties;
    compacting and sintering the powder material at a temperature of 1350-1500° C. in a controlled atmosphere followed by cooling;
    applying one or more post sintering treatments including edge rounding; and
    applying a hard, wear resistant coating by CVD- and or MTCVD-technique, wherein the cubic carbide forming metals include one or more of titanium, tantalum, niobium, vanadium, tungsten and molybdenum, wherein a ratio, by weight percent, of tantalum to niobium is 1-2.5 and a ratio, by weight percent, of titanium to niobium is 0.5-1.5, and wherein the coating comprises a first layer adjacent the cemented carbide substrate of Ti(C,N) having a thickness of from about 3 to 15 μm, an alumina layer adjacent said first layer having a thickness of from about 3 to 15 μm, said alumina layer being composed of $\alpha$-$Al_2O_3$, a further layer adjacent the alumina layer of Ti(C,N) or Ti(C,O,N) having a thickness of from about 1 to 10 μm, and a layer of TiN deposited on top of the outer Ti(C,N) or Ti(C,N,O) layer, wherein a thickness of the TiN layer is less than 3 μm, wherein a total thickness of the coating is less than 30 μm, the thickness of the first Ti(C,N) layer is 1-2 times the thickness of the alumina layer, and the thickness of the outer Ti(C,N) layer is 0.1-1.2 times the thickness of the first Ti(C,N) layer and the alumina layer.

11. The method according to claim 10, wherein the powder mixture is formed with 4.5-6 wt % Co and 6.5-8.5 wt % cubic carbide forming metals, and nitrogen is added in an amount of 1.8-5.5% by weight per each wt % of the cubic carbide forming metals.

12. The method according to claim 10, wherein nitrogen is added through the powder or through the sintering process or a combination thereof.

13. The method according to claim 10, wherein the cubic carbide forming transition metals are selected from the group consisting of titanium, tantalum, niobium and wherein nitrogen is added in an amount of 1.8-5.5% by weight per each wt % of the cubic carbide forming transition metals.

14. The method according to claim 10, wherein the ratio of tantalum to niobium is 1.5-1.9, and the ratio of titanium to niobium is 0.8-1.25.

15. The method according to claim 10, wherein the binder phase enriched surface zone has a binder phase maximum of 1.2-3 times a nominal binder phase content of the cemented carbide substrate.

16. The method according to claim 10, wherein the substrate has an S-value of 0.80-0.94.

17. The method according to claim 16, wherein the S-value is 0.84-0.89.

18. The method according to claim 10, wherein the cemented carbide substrate has a mean intercept length of the WC phase of 0.5 to 0.9 μm.

19. The method according to claim 10, wherein the first layer is in direct contact with the alumina layer.

20. The method according to claim 10, wherein the first layer of Ti(C,N) is in direct contact with the second bonding layer of Ti(C,O,N).

* * * * *